(12) United States Patent
Kanagawa

(10) Patent No.: US 10,523,882 B2
(45) Date of Patent: Dec. 31, 2019

(54) AD CONVERTER, SIGNAL PROCESSING METHOD, SOLID-STATE IMAGING DEVICE, AND ELECTRONIC APPARATUS

(71) Applicant: Sony Corporation, Tokyo (JP)

(72) Inventor: Kyoichi Kanagawa, Kumamoto (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/850,163

(22) Filed: Dec. 21, 2017

(65) Prior Publication Data

US 2018/0139399 A1 May 17, 2018

Related U.S. Application Data

(63) Continuation of application No. 14/798,111, filed on Jul. 13, 2015, now Pat. No. 9,894,299, which is a continuation of application No. 14/268,496, filed on May 2, 2014, now Pat. No. 9,106,852.

(30) Foreign Application Priority Data

Jun. 6, 2013  (JP) ................................ 2013-119933

(51) Int. Cl.
*H04N 5/359* (2011.01)
*H04N 5/3745* (2011.01)
*H04N 5/378* (2011.01)
*H04N 5/357* (2011.01)
*H03M 1/66* (2006.01)

(52) U.S. Cl.
CPC ........... *H04N 5/359* (2013.01); *H04N 5/3575* (2013.01); *H04N 5/378* (2013.01); *H04N 5/37455* (2013.01); *H03M 1/66* (2013.01)

(58) Field of Classification Search
CPC .... H04N 5/37455; H04N 5/376; H04N 5/378; H04N 5/359; H04N 5/3575; H03M 1/66
USPC ................................................. 348/308–310
See application file for complete search history.

(56) References Cited

U.S. PATENT DOCUMENTS

| 8,233,067 | B2 * | 7/2012 | Kondo .................. H04N 5/378 341/165 |
| 8,243,179 | B2 * | 8/2012 | Shoho .................. H04N 5/378 348/294 |
| 8,606,051 | B2 | 12/2013 | Wang et al. |
| 8,654,230 | B2 | 2/2014 | Wakabayashi et al. |

(Continued)

FOREIGN PATENT DOCUMENTS

JP        2010-161484 A      7/2010

*Primary Examiner* — Ngoc Yen T Vu
(74) *Attorney, Agent, or Firm* — Michael Best & Friedrich LLP

(57) ABSTRACT

Provided is an AD converter including a first AD converting unit in which pixel columns of a pixel array are divided into at least two groups, and that compares a first ramp signal and a first pixel signal output from a first group of the pixel columns and performs AD conversion on the first pixel signal; and a second AD converting unit that compares a second ramp signal and a second pixel signal output from a second group of the pixel columns and performs AD conversion on the second pixel signal, in which the first ramp signal is a signal of which a level is decreased with a constant slope over time in a D-phase period for detecting a signal level of a pixel signal, and the second ramp signal is a signal of which a level is increased with a constant slope over time in the D-phase period.

10 Claims, 9 Drawing Sheets

(56) References Cited

U.S. PATENT DOCUMENTS

| | | | |
|---|---|---|---|
| 8,698,928 B2 | 4/2014 | Mishina et al. | |
| 8,704,694 B2 | 4/2014 | Kawahito | |
| 8,759,737 B2 | 6/2014 | Egawa | |
| 8,836,840 B2* | 9/2014 | Kukita | H04N 5/23241 341/164 |
| 8,994,832 B1 | 3/2015 | Yang et al. | |
| 9,113,100 B2* | 8/2015 | Odahara | H04N 5/378 |
| 9,148,590 B2* | 9/2015 | Ishibashi | H04N 5/335 |
| 9,392,204 B2* | 7/2016 | Saito | H04N 5/374 |
| 9,994,832 B2 | 6/2018 | Schnorr | |
| 2009/0051801 A1 | 2/2009 | Mishina et al. | |
| 2011/0205408 A1* | 8/2011 | Suzuki | H04N 5/3745 348/272 |
| 2014/0160334 A1 | 6/2014 | Wakabayashi | |
| 2014/0240568 A1 | 8/2014 | Yamagata et al. | |

* cited by examiner

AD CONVERTER, SIGNAL PROCESSING METHOD, SOLID-STATE IMAGING DEVICE, AND ELECTRONIC APPARATUS

CROSS REFERENCE TO RELATED APPLICATIONS

This is a Continuation of application Ser. No. 14/798,111, filed on Jul. 13, 2015, which is a Continuation of application Ser. No. 14/268,496, filed on May 2, 2014, now U.S. Pat. No. 9,106,852, issued on Aug. 11, 2015, which contains subject matter related to Japanese Priority Patent Application JP 2013-119933 filed Jun. 6, 2013, the entire contents of which are incorporated herein by reference.

BACKGROUND

The present technology relates generally to an AD converter, a signal processing method, a solid-state imaging device, and an electronic apparatus, and specifically, to an AD converter, a signal processing method, a solid-state imaging device, and an electronic apparatus that can decrease the generation of the streaking with simple circuit configurations.

The column AD-type CMOS image sensor performs a Correlated Double Sampling (CDS) process for deleting fixed pattern noises specific to pixels. In the CDS process, an analog pixel signal output from each pixel is compared with a ramp signal that decreases with a constant slope over time by a comparator. Subsequently, for example, down-count performed while a Hi difference signal is only supplied as a comparison result in a Preset Phase (P-phase) period, and up-count performed while a Hi difference signal is only supplied as a comparison result in a Data Phase (D-phase) period.

In the CDS process according to the related art, when an image in which a white region partially exists on a black background is captured, streaking is generated. The streaking refers to a phenomenon in which pixels to be a black background in the horizontal direction of a white region become gray on an image in which the white region partially exists on the black background. A main cause of the generation of the streaking is distortion of a ramp signal by a crosstalk from an output of a comparator.

The applicant of the present application has previously suggested a method of decreasing the generation of the streaking in Japanese Unexamined Patent Application Publication No. 2010-161484.

SUMMARY

However, decreasing the generation of the streaking with a more simple circuit configuration is desired.

In view of the circumstances described above, the present technology has been suggested to decrease the generation of the streaking with a more simple circuit configuration.

According to a first embodiment of the present technology, provided is an AD converter including: a first AD converting unit in which a plurality of pixel columns of a pixel array are divided into at least two groups, and that compares a first ramp signal and a first pixel signal output from a first group of the pixel columns among the two groups and performs AD conversion on the first pixel signal; and a second AD converting unit that compares a second ramp signal and a second pixel signal output from a second group of the pixel columns different from the first group in the pixel array and performs AD conversion on the second pixel signal, in which the first ramp signal is a signal of which a level is decreased with a constant slope over time in a D-phase period for detecting a signal level of a pixel signal, and the second ramp signal is a signal of which a level is increased with a constant slope over time in the D-phase period.

According to a second embodiment of the present technology, provided is a signal processing method of an AD converter including a first AD converting unit in which a plurality of pixel columns of a pixel array are divided into at least two groups and that performs AD conversion on a first pixel signal output from a first group of the pixel columns among the two groups, and a second AD converting unit that performs AD conversion on a second pixel signal output from a second group of the pixel columns different from the first group in the pixel array, the method including: performing AD conversion on the first pixel signal by comparing the first pixel signal and a first ramp signal, of the first AD converting unit; and performing AD conversion on the second pixel signal by comparing the second pixel signal and a second ramp signal, of the second AD converting unit, in which the first ramp signal is a signal of which a level is decreased with a constant slope over time in a D-phase period for detecting a signal level of a pixel signal, and in which the second ramp signal is a signal of which a level is increased with a constant slope over time in the D-phase period.

According to a third embodiment of the present technology, provided is a solid-state imaging device including: a pixel array in which a plurality of pixels are 2-dimensionally arranged in a matrix shape; a first AD converting unit in which a plurality of pixel columns of a pixel array are divided into at least two groups, and that compares a first ramp signal and a first pixel signal output from a first group of the pixel columns among the two groups and performs AD conversion on the first pixel signal; and a second AD converting unit that compares a second ramp signal and a second pixel signal output from a second group of the pixel columns different from the first group in the pixel array and performs AD conversion on the second pixel signal, in which the first ramp signal is a signal of which a level is decreased with a constant slope over time in a D-phase period for detecting a signal level of a pixel signal, and the second ramp signal is a signal of which a level is increased with a constant slope over time in the D-phase period.

According to a fourth embodiment of the present technology, provided is an electronic apparatus including: a solid-state imaging device that includes a pixel array in which a plurality of pixels are 2-dimensionally arranged in a matrix shape, a first AD converting unit in which a plurality of pixel columns of a pixel array are divided into at least two groups, and that compares a first ramp signal and a first pixel signal output from a first group of the pixel columns among the two groups and performs AD conversion on the first pixel signal, and a second AD converting unit that compares a second ramp signal and a second pixel signal output from a second group of the pixel columns different from the first group un the pixel array and performs AD conversion on the second pixel signal, in which the first ramp signal is a signal of which a level is decreased with a constant slope over time in a D-phase period for detecting a signal level of a pixel signal, and the second ramp signal is a signal of which a level is increased with a constant slope over time in the D-phase period.

According to first to fourth embodiments of the present technology, the plurality of pixel columns of the pixel array are divided into at least two groups, a first AD converting unit that performs AD conversion on a first pixel signal output from a first group of the pixel columns among the two groups compares the first pixel signal and a first ramp signal and performs AD conversion on the first pixel signal, a second AD converting unit that performs AD conversion on a second pixel signal output from a second group of the pixel columns different from the first group in the pixel array compares the second pixel signal and a second ramp signal and performs AD conversion on the second pixel signal, a level of the first ramp signal is decreased with a constant slope over time in a D-phase period for detecting a signal level of a pixel signal, and a level of the second ramp signal is increased with a constant slope over time in the D-phase period.

The AD converter, the solid-state imaging device, and the electronic apparatus may be provided as independent apparatuses, or may be a module which is embedded in another apparatus.

According to first to fourth embodiments of the present technology, the generation of the streaking can be decreased with a more simple configuration.

DETAILED DESCRIPTION OF EMBODIMENTS

Hereinafter, embodiments for performing the present technology (hereinafter, referred to as embodiment) are described. Further, the description will be made in the following order.

1. First embodiment (Configuration example of a solid-state imaging device in which an AD conversion process is divided into an odd pixel column and an even pixel column)

2. Second embodiment (Configuration example of a solid-state imaging device in which an AD conversion process is divided into a right portion and a left portion of a pixel array)

3. Third embodiment (Configuration example of electronic apparatus)

1. First Embodiment

Overall Configuration Example of Solid-state Imaging Device

Figure 1:
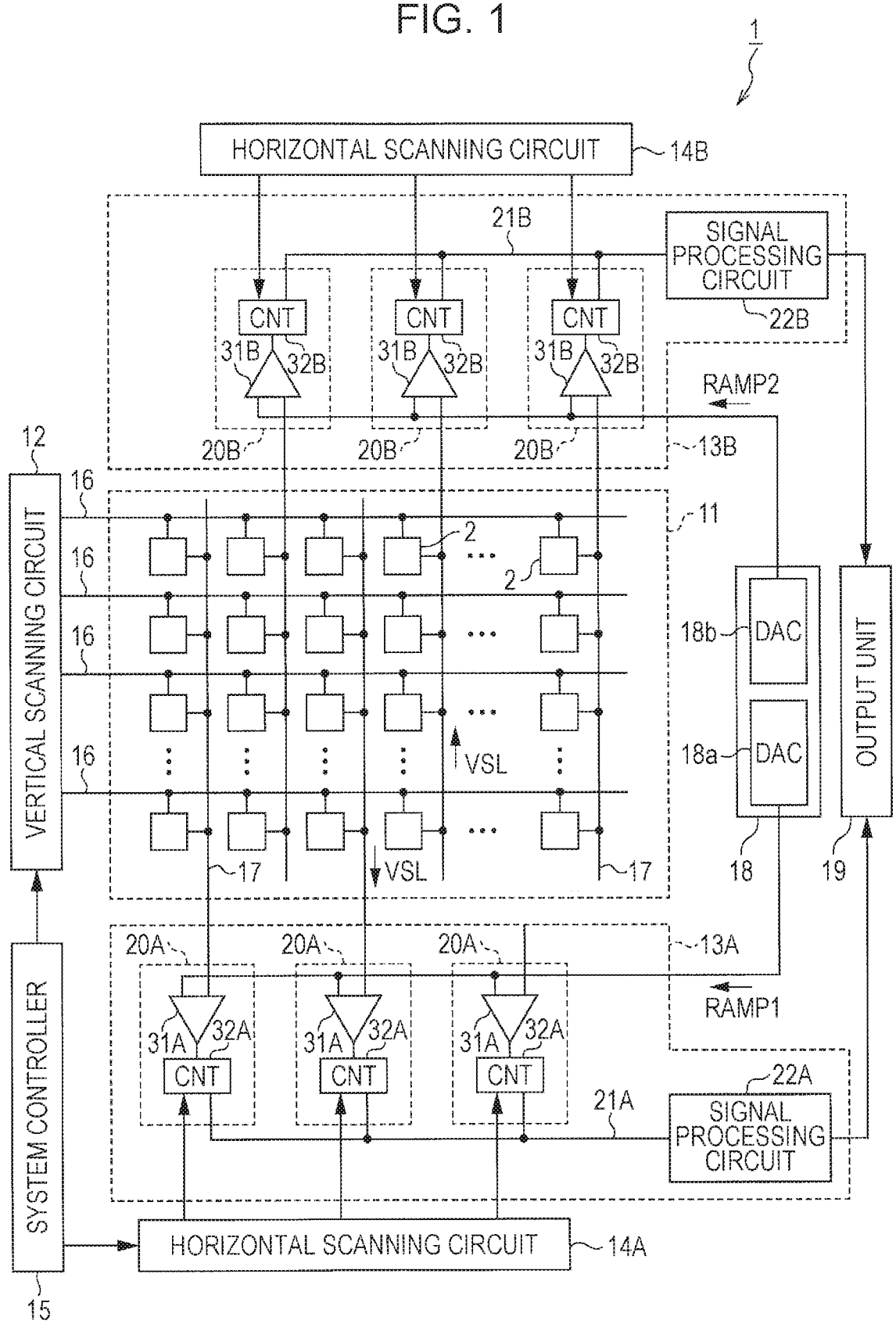
FIG. 1 is a block diagram illustrating a configuration of a solid-state imaging device to which the present technology is applied according to a first embodiment.

FIG. 1 is a block diagram illustrating a configuration of a solid-state imaging device to which the present technology is applied according to a first embodiment.

A solid-state imaging device 1 illustrated in FIG. 1 is configured with a pixel array 11, a vertical scanning circuit 12, an AD converting unit 13, a horizontal scanning circuit 14, a system controller 15, pixel driving lines 16, vertical signal lines 17, a reference signal generating unit 18, an output unit 19, and the like.

Here, the AD converting unit 13 and the horizontal scanning circuit 14 are arranged on the upper portion and the lower portion of the pixel array 11, respectively. Specifically, the AD converting unit 13A and the horizontal scanning circuit 14A are arranged on the lower portion of the pixel array 11, and the AD converting unit 13B and the horizontal scanning circuit 14B are arranged on the upper portion of the pixel array 11.

The pixel array 11 generates light charges corresponding to a received light amount, and has a configuration in which pixels 2 each having an accumulating photoelectric converting unit are arranged in a 2-dimensional matrix shape in column and row directions. Here, the row direction refers to an arrangement direction of a pixel row, that is, a horizontal direction, and the column direction refers to an arrangement direction of a pixel column, that is, a vertical direction.

The pixel 2 is configured to have a photoelectric converting unit such as a photodiode and a plurality of pixel transistors. The plurality of pixel transistors are configured with, for example, four MOS transistors of a transfer transistor, a selection transistor, a reset transistor, and an amplification transistor.

In addition, the pixel 2 can be configured with a pixel sharing structure. The pixel sharing structure is configured with a plurality of photodiodes, a plurality of transfer transistors, one shared floating diffusion (floating diffusion region), and one of each of the other shared pixel transistors each. That is, photodiodes and transfer transistors that configure a plurality of unit pixels are configured to share the one of each of the other pixel transistors, in the shared pixel.

With respect to the pixel arrangement of the pixel array 11 in a matrix shape, the pixel driving line 16 is wired in a horizontal direction in each pixel row, and the vertical signal line 17 is wired in a vertical direction in each pixel column in each pixel column. The pixel driving line 16 transmits a driving signal for performing driving when a pixel signal VSL is read from the pixel 2. In FIG. 1, one wiring line is illustrated for the pixel driving line 16, but the wiring line is not limited to one. One end of the pixel driving line 16 is connected to an output terminal corresponding to each pixel row of the vertical scanning circuit 12.

The vertical scanning circuit 12 is configured with a shift register, an address decoder, or the like, and drives each pixel 2 of the pixel array 11 all at once, by a row unit, or the like. A specific configuration of the vertical scanning circuit 12 is not illustrated, but the vertical scanning circuit 12 is generally configured to have two scanning systems of a reading scanning system and a sweeping scanning system.

The reading scanning system selectively scans the pixels 2 of the pixel array 11 by a row unit in order to read the pixel signals VSL from the pixels 2 in a sequence. The pixel signals VSL read from the pixel 2 are analog signals. The sweeping scanning system performs sweeping scanning prior to the reading scanning by a time of a shutter speed with respect to a read row in which reading scanning is performed by the reading scanning system.

The photoelectric converting unit is reset by sweeping unnecessary charges from the photoelectric converting unit of the pixel 2 in the read row by sweeping scanning of the sweeping scanning system. Subsequently, the so-called electronic shutter operation is performed by sweeping (resetting) unnecessary charges by the sweeping scanning system. Here, the electronic shutter operation refers to an operation of removing light charges of the photoelectric converting unit and starting new exposure (starting accumulation of light charges).

The pixel signal VSL read by the reading operation by the reading scanning system corresponds to the light amount received after the reading operation or the electronic shutter operation preceding the reading operation. Subsequently, a period from reading timing by the reading operation or sweeping timing by the preceding electronic shutter operation to reading timing by the current reading operation is an exposure period of the light charge in the pixel 2.

The pixel signal VSL output from each pixel 2 in a pixel row that is selectively scanned by the vertical scanning circuit 12 is input to the AD converting unit 13A or 13B through each vertical signal line 17 in each pixel columns.

The vertical signal lines 17 of the pixel array 11 in odd pixel columns are connected to the AD converting unit 13A arranged under the pixel array 11. The AD converting unit 13A has a signal processing circuit 22A and column AD converting units 20A that perform a Correlated Double Sampling (CDS) process and an AD conversion process on the pixel signal VSL output from the pixels 2 of the pixel array 11 in the odd pixel columns.

Meanwhile, the vertical signal lines 17 of the pixel array 11 in even pixel columns are connected to the AD converting unit 13B arranged over the pixel array 11. The AD converting unit 13B has a signal processing circuit 22B and column AD converting units 20B that perform a CDS process and an AD conversion process on the pixel signals VSL output from the pixels 2 of the pixel array 11 in the even pixel columns.

Each column AD converting unit 20 (20A and 20B) performs a count process for the CDS process based on the pixel signal VSL supplied from the pixels 2 in the same column through the vertical signal lines 17. The column AD converting units 20 each has comparators 31 and up/down counters (CNT) 32.

A ramp signal RAMP1 is supplied to the column AD converting unit 20A arranged under the pixel array 11 from a DAC 18a of the reference signal generating unit 18. The comparator 31A of the column AD converting unit 20A compares the pixel signal VSL output from the pixel 2 of the pixel array 11 in the odd pixel column and the ramp signal RAMP1 from the DAC 18a. The up/down counter 32A performs down-count or up-count according to the comparison result of the comparator 31A, and outputs the result to the signal processing circuit 22A through a horizontal output line 21A.

The signal processing circuit 22A calculates pixel data obtained by performing the CDS process and the AD conversion process on the analog pixel signal VSL based on the count result in a P-phase (Preset Phase) period and the count result in a D-phase (Data Phase) period. Here, the P-phase period is a period for detecting a reset level in the CDS process and the D-phase period is a period for detecting a signal level in the CDS process.

A ramp signal RAMP2 is supplied to the column AD converting unit 20B arranged over the pixel array 11 from a DAC 18b of the reference signal generating unit 18. The difference between the ramp signal RAMP1 and the ramp signal RAMP2 is described below.

The comparator 31B of the column AD converting unit 20B compares the pixel signal VSL output from the pixel 2 of the pixel array 11 in the even pixel column and the ramp signal RAMP2 from the DAC 18b. An up/down counter 32B performs down-count or up-count according to the comparison result of the comparator 31B, and outputs the result to the signal processing circuit 22B through a horizontal output line 21B.

The signal processing circuit 22B calculates pixel data obtained by performing the CDS process and the AD conversion process on the analog pixel signal VSL based on the count result in the P-phase period and the count result in the D-phase period.

The AD converting units 13A and 13B are configured to have an AD converting apparatus that performs the CDS process and the AD conversion on the analog pixel signal VSL. In addition, the AD converting apparatus may be configured to include the reference signal generating unit 18 that generates the ramp signals RAMP1 and RAMP2. Hereinafter, the CDS process and the AD conversion performed by the AD converting units 13A and 13B are collectively referred to as an AD conversion process.

The horizontal scanning circuit 14A selects each column AD converting unit 20A that is configured with a shift register and an address decoder and that corresponds to the odd pixel column, in a predetermined order. The count result temporarily stored in each column AD converting unit 20A in the AD converting unit 13A is sequentially output to the signal processing circuit 22A through the horizontal output line 21A by the selective scanning by the horizontal scanning circuit 14A.

In the same manner as that of the horizontal scanning circuit 14A, the horizontal scanning circuit 14B selects each column AD converting unit 20B that is configured with a shift register and an address decoder and that corresponds to the even pixel column, in a predetermined order. The count result temporarily stored in each column AD converting unit 20B in the AD converting unit 13B is sequentially output to the signal processing circuit 22B through the horizontal output line 21B by the selective scanning by the horizontal scanning circuit 14B.

The system controller 15 is configured with a timing generator that generates various kinds of timing signals and the like, and performs control for driving the vertical scanning circuit 12, the AD converting unit 13, the horizontal scanning circuit 14, and the like based on the various kinds of timings generated by the timing generator. Further, in FIG. 1, a portion of control signals from the system controller 15 to each unit is not illustrated.

The reference signal generating unit 18 has the Digital-to-Analog Converting units (DACs) 18a and 18b that generate the different ramp signals RAMP1 and RAMP2. The ramp signal RAMP1 generated in the DAC 18a is supplied to the comparator 31A in each column AD converting unit 20A of the AD converting unit 13A. The ramp signal RAMP2 generated in the DAC 18b is supplied to the comparator 31B in each column AD converting unit 20B of the AD converting unit 13B.

The output unit 19 alternately selects for example, pixel data in the odd pixel column supplied from the signal processing circuit 22A and pixel data in the even pixel column supplied from the signal processing circuit 22B so as to be the arrangement sequence of the pixel 2 in the pixel array 11, and outputs the data to the outside of the solid-state imaging device 1.

The solid-state imaging device 1 configured as described above is a CMOS image sensor formed by a method called a column AD method in which the column AD converting units 20 that perform the CDS process and the AD conversion process are arranged for each pixel column.

Circuit Configuration Example in Pixel

Figure 2:
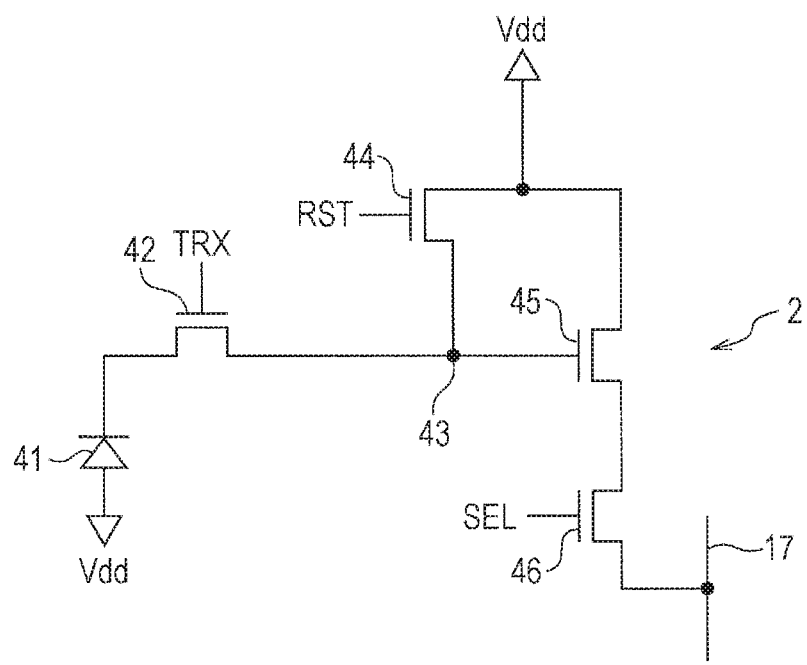
FIG. 2 is a diagram illustrating a circuit configuration example in a pixel.

FIG. 2 is a diagram illustrating a circuit configuration example in the pixel 2.

The pixel 2 has a photodiode 41 as a photoelectric conversion element, a transfer transistor 42, a floating diffusion (FD) 43, a reset transistor 44, an amplification transistor 45, and a selection transistor 46.

The photodiode 41 generates and accumulates charges (signal charges) corresponding to the received light amount. In the photodiode 41, an anode is grounded and a cathode is connected to the FD 43 through the transfer transistor 42.

When the transfer transistor 42 is turned on by a transfer signal TRX, the transfer transistor 42 reads charges generated from the photodiode 41, and transmits the charges to the FD 43.

The FD 43 stores the charges read from the photodiode 41. When the reset transistor 44 is turned on by the reset signal RST, the reset transistor 44 resets an electric potential of the FD 43 by discharging charges accumulated in the FD 43 to a drain (constant voltage source Vdd).

The amplification transistor 45 outputs the pixel signal corresponding to the electric potential of the FD 43. That is, the amplification transistor 45 configures a source follower circuit and a load MOS (not illustrated) as a constant current source connected through the vertical signal line 17, and the pixel signal indicating a level corresponding to charges accumulated in the FD 43 is output from the amplification transistor 45 through the selection transistor 46 to the column AD converting unit 20.

The selection transistor 46 is turned on when the pixel 2 is selected by a selection signal SEL, and outputs the pixel signal of the pixel 2 to the column AD converting unit 20 through the vertical signal line 17. Each signal line through which the transfer signal TRX, the selection signal SEL, and the reset signal RST are transmitted corresponds to the pixel driving line 16 of FIG. 1.

The pixel 2 can be configured as described above, but is not limited thereto, and other configurations can be adopted.

The solid-state imaging device 1 in FIG. 1 is configured to perform different processes from the AD converting unit 13A that performs the AD conversion process on the pixel signal in the odd pixel column, and the AD converting unit 13B that performs the AD conversion process on the pixel signal in the even pixel column, in order to decrease the generation of streaking.

Hereinafter, processes respectively performed by the AD converting unit 13A and the AD converting unit 13B are described in detail.

First, the streaking phenomenon and the cause thereof are described with reference to FIGS. 3A to 4.

Figure 3A:
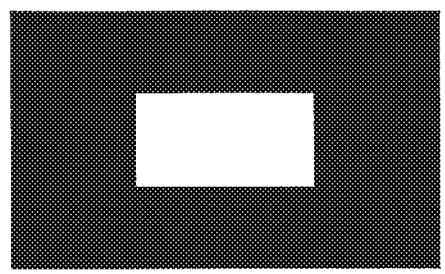
FIGS. 3A to 3C are diagrams illustrating a streaking phenomenon and the cause thereof.
Figure 3B:
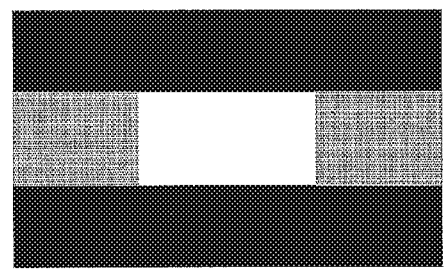
Figure 3C:
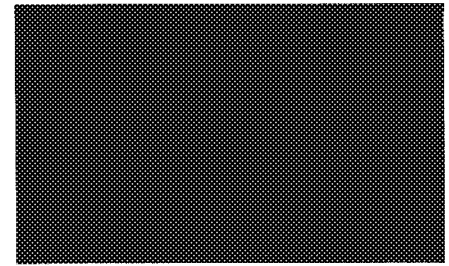

The streaking refers to a phenomenon, in which when an image in which a white region (bright region) exists in a portion of an image on a black background (black region) is captured as illustrated in FIG. 3A, pixels of the white region in the horizontal direction which are to be the black background become gray as illustrated in FIG. 3B. The reason for the generation of the streaking is described by comparing with the case of capturing an image of which all pixels are the black background as illustrated in FIG. 3C. Further, as described below, an image in which pixel values of all pixels are black as illustrated in FIG. 3C is referred to as an all-black image, and an image in which a white region exists in a portion of an image on the black background as illustrated in FIG. 3A is referred to as a white image on the black background.

Figure 4:
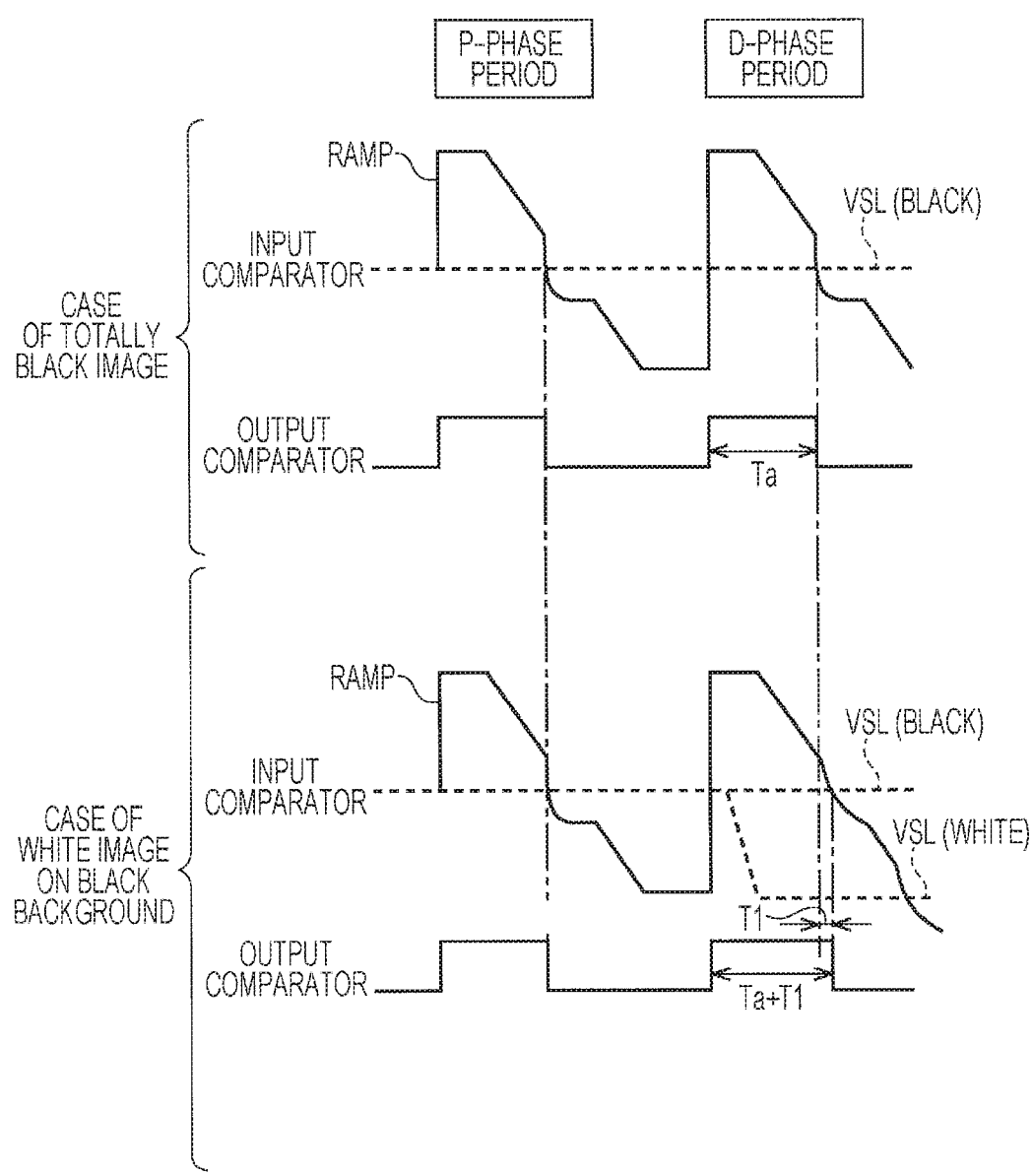
FIG. 4 is a diagram illustrating a streaking phenomenon and the cause thereof.

FIG. 4 is a diagram illustrating input and output signals of a comparator that performs the AD conversion process according to the related art.

On the upper portion of FIG. 4, input and output signals of the comparator in the case of capturing an image of an object that becomes an all-black image as illustrated in FIG. 3C are illustrated. On the lower portion of FIG. 4, input and output signals of the comparator in the case of capturing an image of an object that becomes a white image on the black background as illustrated in FIG. 3A are illustrated.

The analog pixel signal VSL output from each pixel and the ramp signal RAMP of which the level (voltage value) is decreased with constant slope over time are input to the comparator. Further, the ramp signal RAMP is specifically a signal of which the level changes in a stepwise manner over time to have a constant slope.

The comparator compares the input pixel signal VSL and the ramp signal RAMP of which the level is decreased with a constant slope in the P-phase period. If the level of the ramp signal RAMP is greater than that of the pixel signal VSL, the comparator outputs the difference signal of Hi (High). Subsequently, when the levels of the pixel signal VSL and the ramp signal RAMP are the same, the comparator inverts the output to output the difference signal of Lo (Low). The up/down counter down-counts a period from the time at which the ramp signal RAMP starts the voltage drop to the time at which the level of the ramp signal RAMP becomes the same as that of the pixel signal VSL in the P-phase period.

If the P-phase period ends, the level of the ramp signal RAMP is reset to a predetermined voltage before the count is started. Subsequently, the comparator compares the input pixel signal VSL and the ramp signal RAMP of which the level is decreased with a constant slope in the D-phase period. If the level of the ramp signal RAMP is greater than that of the pixel signal VSL, the comparator outputs the difference signal of Hi. Subsequently, when the levels of the pixel signal VSL and the ramp signal RAMP are the same, the comparator inverts the output to output the difference signal of Lo. The up/down counter up-counts a period from the time at which the ramp signal RAMP starts the voltage drop to the time at which the level of the ramp signal RAMP becomes the same as that of the pixel signal VSL in the D-phase period.

Subsequently, the signal processing circuit at the rear end of the up/down counter obtains the down-count value in the P-phase period and the up-count value of the D-phase period, adds up the values, and outputs the result as a pixel data (digital pixel signal) after the AD conversion.

The ramp signal RAMP is ideally a signal of which the level is decreased with a constant slope over time. However, in reality, the crosstalk is generated by the simultaneous inversion of the outputs of the comparator, and the ramp signal RAMP is distorted at the time of the simultaneous inversion of the outputs of the comparator as illustrated in FIG. 4.

If an all-black image as illustrated in FIG. 4 is captured, the outputs of the comparator for all pixels in the read pixel row are inverted at the same time (simultaneously inverted) in both the P-phase period and the D-phase period. Therefore, the distortion amount of the ramp signal RAMP at the time of the simultaneous inversion in the P-phase period, and the distortion amount of the ramp signal RAMP at the time of the simultaneous inversion in the D-phase period are almost the same. The deviation of the count value generated by the distortion of the ramp signal RAMP is cancelled.

Here, a Hi signal output period in the D-phase period for the all-black image is denoted by Ta.

In contrast, in the case of capturing a white image on the black background as illustrated on the lower portion of FIG. 4, the levels of the pixel signal VSL in the D-phase period are two kinds of levels as illustrated in the lower portion of FIG. 4: a level corresponding to a white pixel and a level corresponding to a black pixel. For this, the outputs of the comparator are simultaneously inverted for all pixels in the read pixel row in the D-phase period for the all-black image, while the outputs of the comparator are first inverted for a portion of pixels corresponding to the black pixels in the read pixel row in the D-phase period for the white image on the black background and then inverted for the rest of pixels corresponding to the white pixels. According to this, since the timing in which the outputs of the comparator are inverted is divided into two timings of a timing for black pixels and a timing for white pixels, the distortion amount of the ramp signal RAMP in the inversion timing of the black pixel in the case of the white image on the black background is smaller than the distortion amount of the ramp signal RAMP in the inversion timing of the black pixel in the case of the all-black image. A Hi signal output period in the D-phase period for the white image on the black background becomes a period Ta+T1 which is longer by a period T1 than the Hi signal output period Ta at the time of the all-black image due to the difference between a distortion amount of the ramp signal RAMP at the time of the simultaneous inversion for the black pixel in the all-black image and the distortion amount of the ramp signal RAMP at the time of the simultaneous inversion for the black pixel in the white image on the black background. The difference T1 between the Hi signal output period Ta+T1 in the D-phase period at the time of the white image on the black background and the Hi signal output period Ta at the time of the all-black image appears as a count value and becomes a streaking amount T1.

As described above, in the CDS process according to the related art, a crosstalk is generated by the simultaneous inversion of the output of the comparator, and the difference between the distortion amount of the ramp signal RAMP at the time of the simultaneous inversion in the all-black image and the distortion amount of the ramp signal RAMP at the time of the simultaneous inversion in the white image on the black background causes the generation of the streaking.

First AD Conversion Process

Subsequently, the first AD conversion process performed by the solid-state imaging device 1 in which the generation of the streaking is decreased is described.

The solid-state imaging device 1 is configured so that even if the pixel signals VSL are on the same level, the inversion timings for the outputs of the comparators in the AD converting unit 13A arranged under the pixel array 11 are different from those for the outputs of the comparators in the AD converting unit 13B arranged over the pixel array 11. In other words, it is configured so that even if the pixel signals VSL are on the same level, the inversion timings for the outputs of the comparators for the odd pixel columns of the pixel array 11 are different from those for the outputs of the comparators for the even pixel columns of the pixel array 11.

Specifically, the ramp signal RAMP1 of which the level is decreased with a constant slope over time in the same manner as in the related art is supplied from the DAC 18a to the comparator 31A of the AD converting unit 13A arranged under the pixel array 11.

Meanwhile, the ramp signal RAMP2 of which the level is inverted from the ramp signal RAMP1 in the D-phase period is supplied from the DAC 18b to the comparator 31B of the AD converting unit 13B arranged over the pixel array 11. That is, the ramp signal RAMP2 of which the level is increased with a constant slope over time is supplied from the DAC 18b to the comparator 31B in the D-phase period. According to this, even if the pixel signals VSL are on the same level, the inversion timings for the outputs of the comparator 31A to which the ramp signal RAMP1 is supplied are different from those for the outputs of the comparator 31B to which the ramp signal RAMP2 is supplied.

Respective operations of the comparator 31A to which the ramp signal RAMP1 is supplied and the comparator 31B to which the ramp signal RAMP2 is supplied are sequentially described with reference to FIGS. 5 and 6.

AD Conversion Process of AD Converting Unit 13A

First, an operation of the AD converting unit 13A arranged under the pixel array 11 is described with reference to FIG. 5.

The operation of the AD converting unit 13A arranged under the pixel array 11 is different from the driving according to the related art as illustrated in FIG. 4 in that the distortion amount of the ramp signal RAMP1 when the outputs of the comparator 31A are simultaneously inverted in D-phase period for the all-black image is smaller than the distortion amount of the ramp signal RAMP according to the related art as illustrated in FIG. 4. For comparison, the distortion of the ramp signal RAMP according to the related art as illustrated in FIG. 4 is illustrated with an alternating long and short dash line on the ramp signal RAMP1 for the all-black image on the upper portion of FIG. 5.

As described above, the distortion of the ramp signal RAMP1 is generated by the crosstalk caused by the simultaneous inversion of the outputs of the comparator. According to the present embodiment, since only the column AD converting units 20 corresponding to the odd pixel column are arranged in the AD converting unit 13A under the pixel array 11, the number of comparators 31A is half the number of comparators 31A according to the related art. Subsequently, although the detailed description will be made with reference to FIG. 6, since the ramp signal RAMP1 and the ramp signal RAMP2 are different from each other, the timing at which the outputs of the comparator 31A of the AD converting unit 13A are simultaneously inverted is different from the timing at which the outputs of the comparator 31B of the AD converting unit 13B over the pixel array 11 are simultaneously inverted. According to this, since the number of comparators 31A of which the outputs are simultaneously inverted in the D-phase period for the all-black image is half the number of comparators 31A according to the related art, the distortion amount of the ramp signal RAMP1 when the outputs of the comparator 31A are simultaneously inverted is smaller than the distortion amount of the ramp signal RAMP according to the related art as illustrated in FIG. 4.

Since the distortion amount of the ramp signal RAMP1 in the D-phase period for the all-black image is smaller than the distortion amount of the ramp signal RAMP of FIG. 4, a Hi signal output period Tb of the comparator 31A in the D-phase period for the all-black image is longer than the Hi signal output period Ta of FIG. 4 (Ta<Tb).

Figure 5:
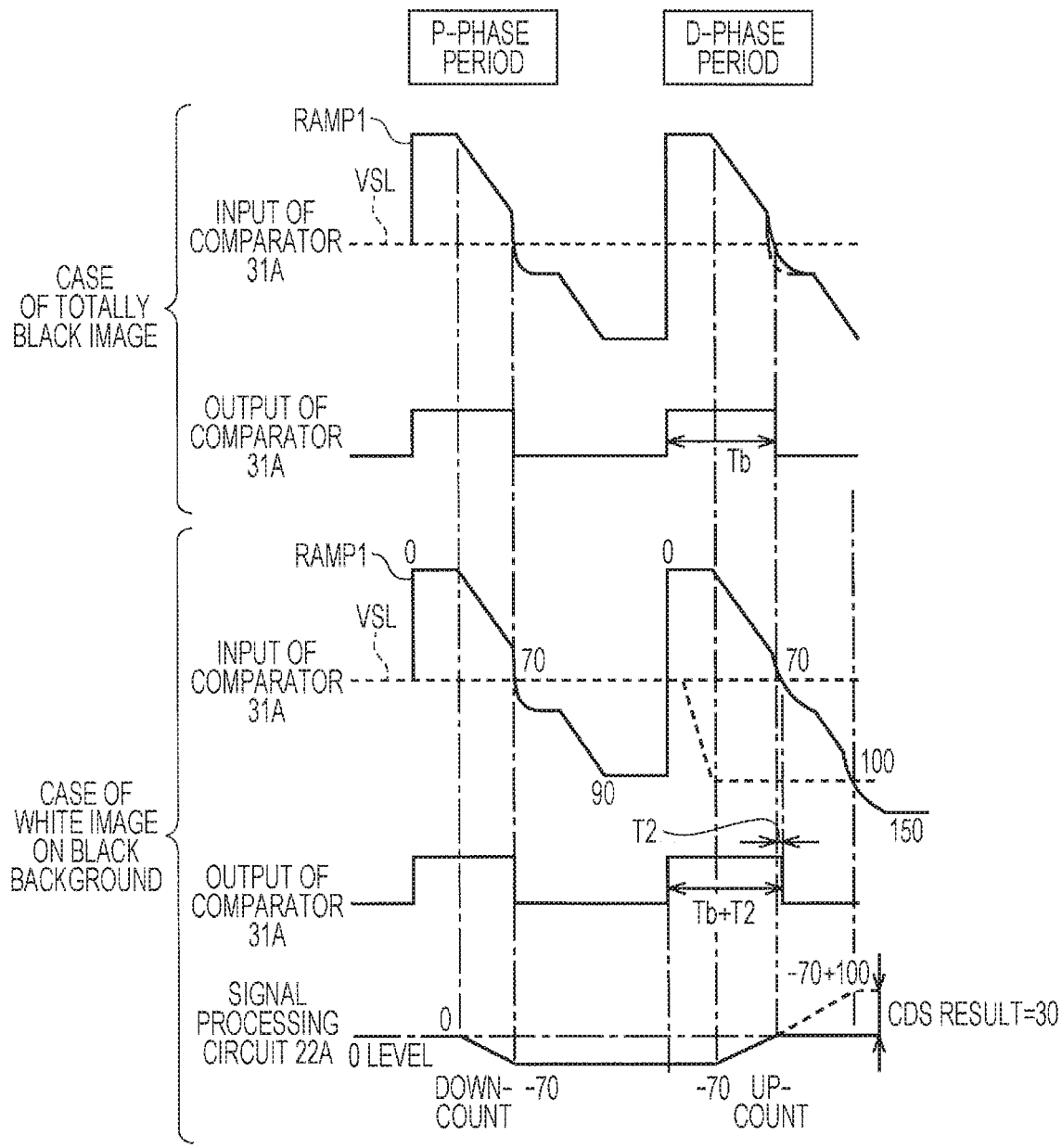
FIG. 5 is a diagram illustrating an operation of a first AD conversion process of an AD converting unit arranged under a pixel array.

Therefore, a streaking amount T2 corresponding to the difference between the distortion amount of the ramp signal RAMP1 in the D-phase period when the white image on the black background is captured as illustrated in the lower portion of FIG. 5 and the distortion amount of the ramp signal RAMP1 in the D-phase period for the all-black image in the upper portion of FIG. 5 is smaller than the streaking amount T1 according to the related art (T1>T2). Accordingly, the generation of the streaking can be decreased by the solid-state imaging device 1.

The operation itself performed by the AD converting unit 13A is the same as the AD conversion process according to the related art described with reference to FIG. 4.

That is, the analog pixel signal VSL output from each pixel and the ramp signal RAMP1 of which the level (voltage value) is decreased with a constant slope over time in both the P-phase period and the D-phase period are input to the comparator 31A.

In the P-phase period, the comparator 31A compares the input pixel signal VSL and the ramp signal RAMP1 of which the level is decreased with a constant slope. If the level of the ramp signal RAMP1 is greater than the level of the pixel signal VSL, the comparator 31A outputs the difference signal of Hi. Subsequently, when the levels of the pixel signal VSL and the ramp signal RAMP are the same, the comparator 31A inverts the output to output the difference signal of Lo. The up/down counter 32A down-counts a period from the time at which the ramp signal RAMP1 starts the voltage drop to the time at which the level of the ramp signal RAMP1 becomes the same as that of the pixel signal VSL in the P-phase period.

If the P-phase period ends, the level of the ramp signal RAMP1 is reset to a predetermined voltage before the count is started. Subsequently, the comparator 31A compares the received pixel signal VSL and the ramp signal RAMP1 of which the level is decreased with a constant slope in the D-phase period. If the level of the ramp signal RAMP1 is greater than that of the pixel signal VSL, the comparator 31A outputs the difference signal of Hi. Subsequently, when the levels of the pixel signal VSL and the ramp signal RAMP1 are the same, the comparator 31A inverts the output to output the difference signal of Lo. The up/down counter 32A up-counts a period from the time at which the ramp signal RAMP1 starts the voltage drop to the time at which the level of the ramp signal RAMP1 becomes the same as that of the pixel signal VSL in the D-phase period.

The signal processing circuit 22A obtains the down-count value in the P-phase period and the up-count value in the D-phase period, adds up the values, and outputs the result as a pixel data after the AD conversion.

For example, as illustrated in FIG. 5, the down-count value of the up/down counter 32A in the P-phase period when the white image on the black background is captured is −70. In addition, in the D-phase period, the up-count value of the up/down counter 32A until the ramp signal RAMP1 intersects with the pixel signal VSL of the black pixel is 70, and the up-count value of the up/down counter 32A until the ramp signal RAMP1 intersects with the pixel signal VSL of the white pixel is 100. In this case, the pixel data after the AD conversion of the black pixel (black background) that is calculated by the signal processing circuit 22A is −70+70=0, and the pixel data after the AD conversion of the white pixel (white region) is −70+100=30.

Further, in the example of FIG. 5, the maximum count value in the P-phase period (P range) is set to be 90, and the maximum count value in the D-phase period (D range) is set to be 150.

AD Conversion Process of AD Converting Unit 13B

Subsequently, an operation of the AD converting unit 13B arranged over the pixel array 11 is described with reference to FIG. 6.

The operation of the AD converting unit 13B in the P-phase period is the same as that of the AD converting unit 13A as described above. Accordingly, the ramp signal RAMP2 supplied from the DAC 18b in the P-phase period is a signal of which the level is decreased with a constant slope over time in the same manner as in the ramp signal RAMP1. The up/down counter 32B down-counts a period from the time at which the ramp signal RAMP2 starts the voltage drop to the time at which the level of the ramp signal RAMP2 becomes the same as that of the pixel signal VSL in the P-phase period. For example, as illustrated in FIG. 6, the down-count value of the up/down counter 32B in the P-phase period is −70.

Figure 6:
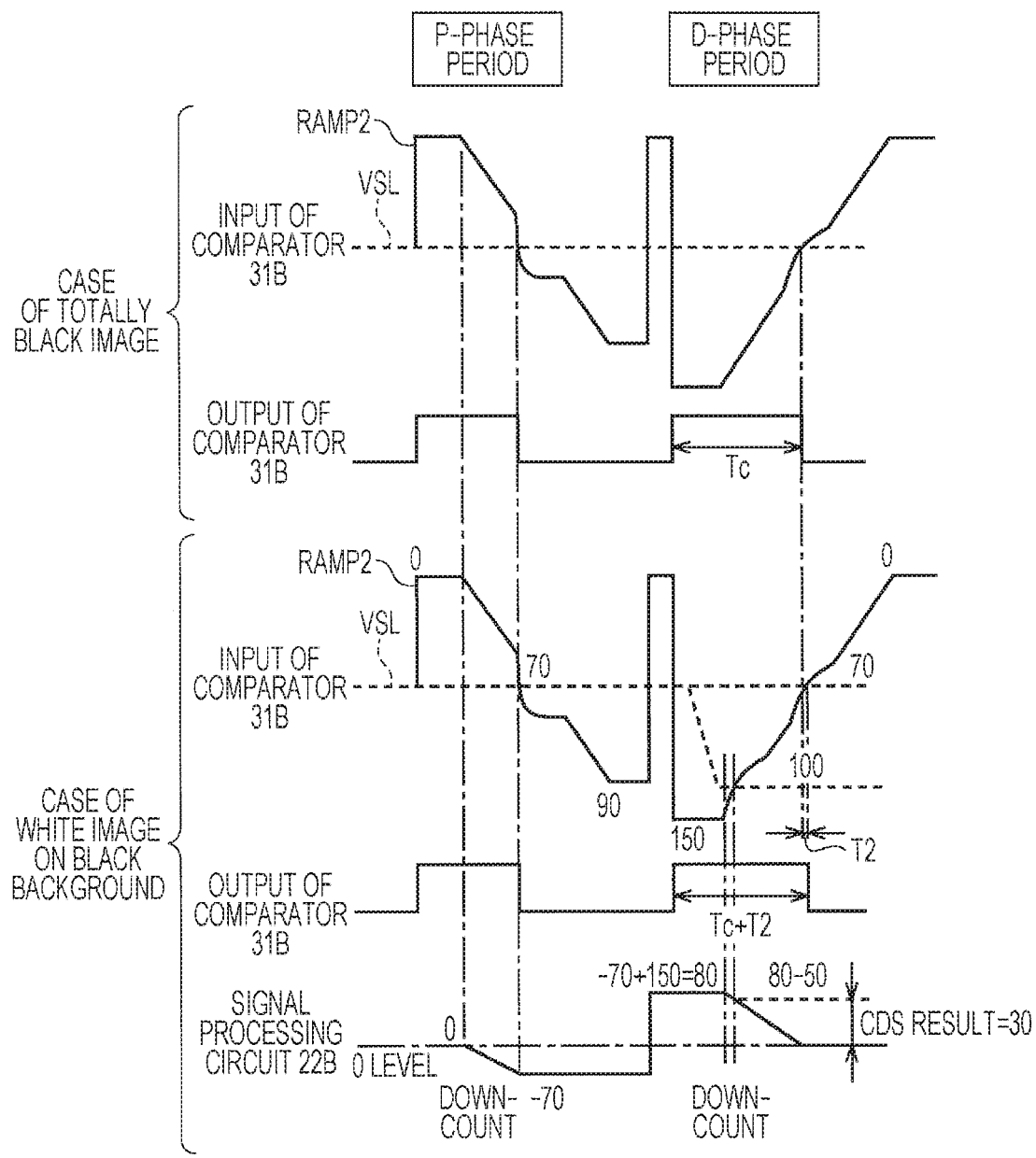
FIG. 6 is a diagram illustrating an operation of a first AD conversion process of an AD converting unit arranged over the pixel array.

The ramp signal RAMP2 supplied from the DAC 18b is a signal that is inverted by the D range and of which the level is increased with a constant slope over time in the next D-phase period as illustrated in FIG. 6. Subsequently, up/down counter 32B down-counts a period from the time at which the ramp signal RAMP2 starts the voltage rise to the time at which the level of the ramp signal RAMP2 becomes the same as that of the pixel signal VSL of the white pixel or the black pixel in the D-phase period. Since the level is increased with a constant slope over time, the ramp signal RAMP2 first intersects with the pixel signal VSL of the white pixel and then intersects with the pixel signal VSL of the black pixel.

The signal processing circuit 22B first obtains the down-count value of the up/down counter 32B in the P-phase period. In the example of FIG. 6, the signal processing circuit 22B obtains −70, as a down-count value.

Then, the signal processing circuit 22B adds the count value corresponding to the D range to the down-count value in the P-phase period according to the initial level inversion of the ramp signal RAMP2 in the D-phase period. In this example, since the D range is 150, the signal processing circuit 22B calculates that −70+150=80.

Finally, the signal processing circuit 22B obtains the down-count value of the up/down counter 32B in the D-phase period and adds the value to the stored count result. In the example of FIG. 6, the down-count value of the up/down counter 32B until the level of the ramp signal RAMP2 becomes the same as the level of the pixel signal VSL of the white pixel is −50, and the down-count value of the up/down counter 32B until the level of the ramp signal RAMP2 becomes the same as the level of the pixel signal VSL of the black pixel is −80. In this case, the pixel data after the AD conversion of the white pixel (white region) calculated by the signal processing circuit 22B is 80−50=30, and the pixel data after the AD conversion of the black pixel (black background) is 80−80=0. Accordingly, the same pixel data as the AD converting unit 13A that performs the operation according to the related art can be obtained in both cases of the white pixel and the black pixel.

In the all-black image on the upper surface of FIG. 6, a Hi signal output period Tc of the comparator 31B is a period in which the level of the ramp signal RAMP2 is inverted from that of the ramp signal RAMP1, and is a period that is different from a Hi signal output period Tb of the comparator 31A of the AD converting unit 13A. As a result, since the number of the comparators 31B of which the outputs are simultaneously inverted is half the number of the comparators according to the related art in the D-phase period of the all-black image, the distortion amount of the ramp signal RAMP2 when the output of the comparator 31B is simultaneously inverted is smaller than the distortion amount of the ramp signal RAMP according to the related art as illustrated in FIG. 4. According to this, the streaking amount T2 corresponding to the difference between the distortion amount of the ramp signal RAMP2 in the D-phase period when the white image on the black background is captured as illustrated in the lower portion of FIG. 6 and the distortion amount of the ramp signal RAMP2 in the D-phase period for the all-black image in the upper portion of FIG. 6 is smaller than the streaking amount T1 according to the related art (T1>T2). Accordingly, the generation of the streaking can be decreased by the solid-state imaging device 1.

Second AD Conversion Process

Subsequently, a second AD conversion process that can be performed by the solid-state imaging device 1 of FIG. 1 and that is different from the first AD conversion process described above is described.

In the first AD conversion process described above, the signal processing circuit 22B necessarily adds the count value corresponding to the D range to the down-count values in the P-phase period according to the level inversion by the D range of the ramp signal RAMP2 in the D-phase period.

Accordingly, the actual D range may vary due to the variation of the pixel signal VSL so that the actual D range may not be identical to the count number corresponding to the D range which is added to the down-count value in the P-phase period. Here, in the second AD conversion process described below, a method in which the count value corresponding to the D range is not added is employed.

Since the operation of the AD converting unit 13A in the second AD conversion process is the same as the operation of the AD converting unit 13A in the first AD conversion process as illustrated in FIG. 5, the description thereof is omitted.

Figure 7:
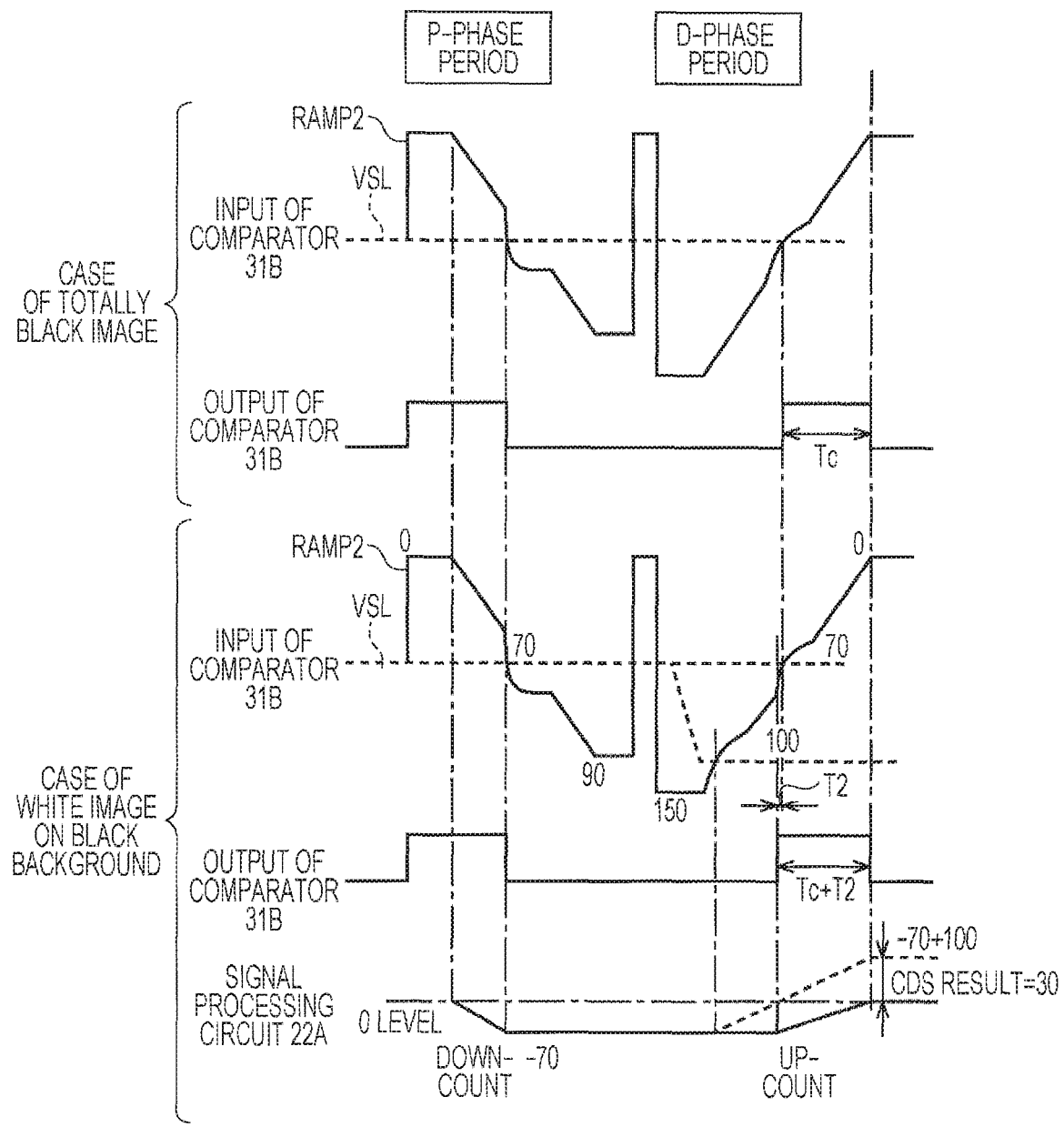
FIG. 7 is a diagram illustrating an operation of a second AD conversion process of an AD converting unit arranged under the pixel array.

FIG. 7 is a diagram illustrating an operation of the AD converting unit 13B in the second AD conversion process.

The operation in the P-phase period is the same as that of the AD converting unit 13B in the first AD conversion process described above. That is, the comparator 31B outputs the difference signal obtained by comparing the ramp signal RAMP2 of which the level is decreased with a constant slope over time and the pixel signal VSL, in the P-phase period. The up/down counter 32B down-counts a period from the time at which the ramp signal RAMP2 starts the voltage drop to the time at which the level of the ramp signal RAMP2 becomes the same as that of the pixel signal VSL.

In the next D-phase period, the level of the ramp signal RAMP2 supplied from the DAC 18b is inverted by the D range as illustrated in FIG. 7, and is increased with a constant slope over time. The comparator 31B outputs the difference signal of Hi from the time at which the level of the ramp signal RAMP2 becomes the same as the level of the pixel signal VSL to the time at which the level of the ramp signal RAMP2 reaches the maximum level. The up/down counter 32B up-counts a period from the time at which the level of the ramp signal RAMP2 becomes the same as the level of the pixel signal VSL to the time at which the level of the ramp signal RAMP2 reaches the maximum level in the D-phase period.

The signal processing circuit 22B obtains the down-count value of the up/down counter 32B in the P-phase period and the up-count value of the up/down counter 32B in the D-phase period. Then, the signal processing circuit 22B outputs the result obtained by adding the down-count value in the P-phase period and the up-count value in the D-phase period, as pixel data.

For example, as illustrated in FIG. 7, the down-count value of the up/down counter 32B in the P-phase period is −70. Subsequently, the up-count value from the time at which the level of the ramp signal RAMP2 becomes the same as the level of the pixel signal VSL of the white pixel to the time at which the level of the ramp signal RAMP2 reaches the maximum level in the D-phase period is 100. In addition, the up-count value from the time at which the level of the ramp signal RAMP2 becomes the same as the level of the pixel signal VSL of the black pixel to the time at which the level of the ramp signal RAMP2 reaches the maximum level is 70. In this case, the pixel data after the AD conversion of the white pixel (white region) calculated by the signal processing circuit 22B is −70+100=30, and the pixel data after the AD conversion of the black pixel (black background) is −70+70=0. Accordingly, the same pixel data as the AD converting unit 13A that performs the operation according to the related art can be obtained.

Since the level of the ramp signal RAMP2 is inverted from that of the ramp signal RAMP1 in the second AD conversion process, a Hi signal output period Tc of the comparator 31B becomes a period different from a Hi signal output period Tb of the comparator 31A of the AD converting unit 13A. As a result, since the number of the comparators 31B of which the outputs are simultaneously inverted is half the number of the comparators according to the related art in the D-phase period of the all-black image, the distortion amount of the ramp signal RAMP2 when the output of the comparator 31B is simultaneously inverted is smaller than the distortion amount of the ramp signal RAMP according to the related art as illustrated in FIG. 4. Accordingly, the streaking amount T2 corresponding to the difference between the distortion amount of the ramp signal RAMP2 in the D-phase period when the white image on the black background is captured as illustrated in the lower portion of FIG. 7 and the distortion amount of the ramp signal RAMP2 in the D-phase period for the all-black image in the upper portion of FIG. 7 is smaller than the streaking amount T1 according to the related art (T1>T2). Accordingly, the generation of the streaking can be decreased by the solid-state imaging device 1.

Additionally, since the signal processing circuit 22B does not have to add the count number corresponding to the D range to the down-count value in the P-phase period corresponding to the level inversion of the ramp signal RAMP2 in the D-phase period in the second AD conversion process, the signal processing circuit 22B can be configured so as not to be influenced by the variation of the D range.

The solid-state imaging device 1 can select any one of the first AD conversion process and the second AD conversion process described above, for example, based on the setting control signal from the outside, and performs the selected process. Of course, the solid-state imaging device 1 may be set to fixedly perform any one of the first AD conversion process and the second AD conversion process described above.

Further, according to the present embodiment, the ramp signal RAMP1 is supplied to the AD converting unit 13A that performs the AD conversion process on the pixel signal VSL in the odd pixel column and the ramp signal RAMP2 is supplied to the AD converting unit 13B that performs the AD conversion process on the pixel signal VSL in the even pixel column. However, the ramp signal RAMP2 may be supplied to the AD converting unit 13A and the ramp signal RAMP1 may be supplied to the AD converting unit 13B.

2. Second Embodiment

Overall Configuration Example of Solid-state Imaging Device

Figure 8:
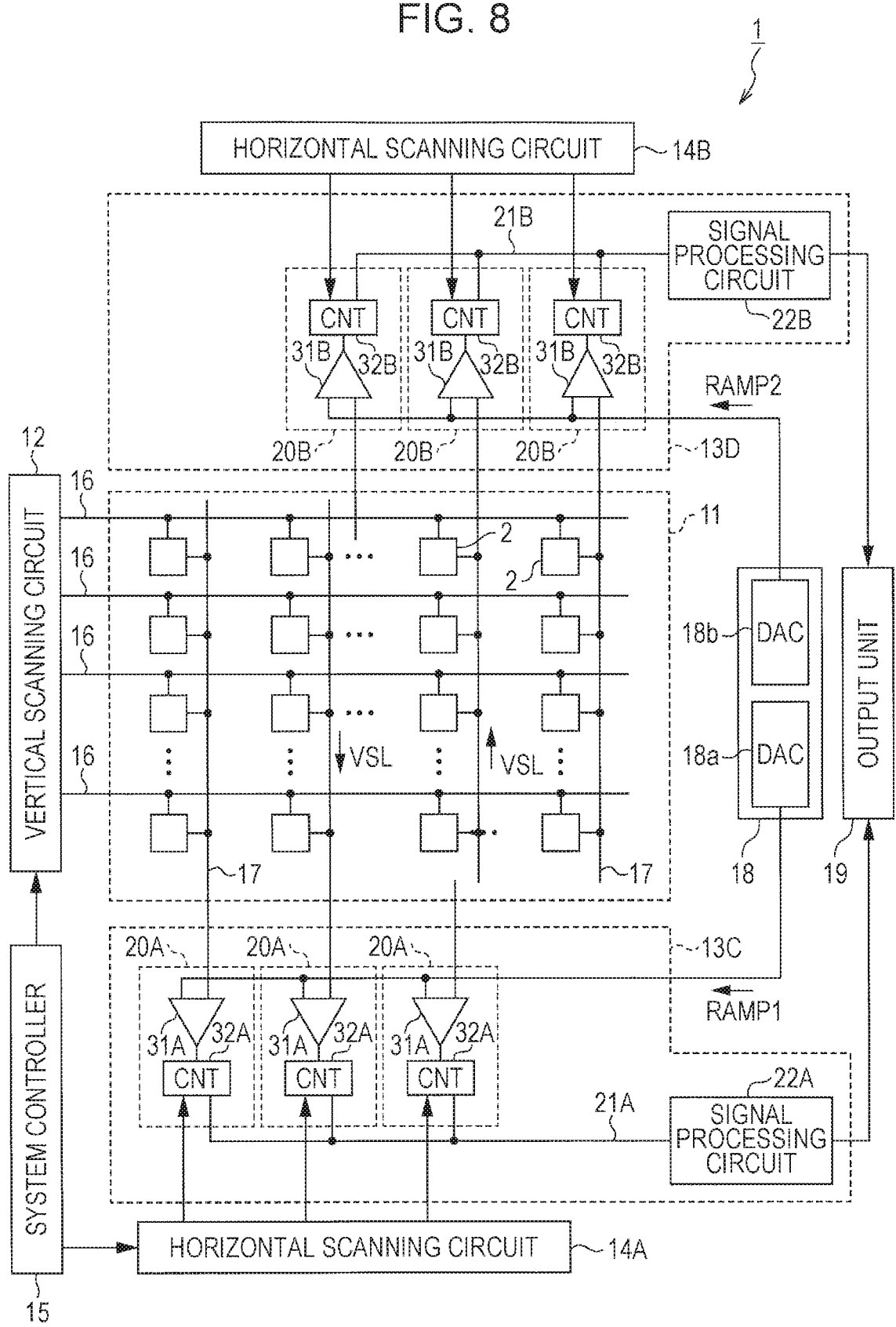
FIG. 8 is a block diagram illustrating a configuration of a solid-state imaging device to which the present technology is applied according to a second embodiment.

FIG. 8 is a block diagram illustrating a configuration of a solid-state imaging device according to a second embodiment to which the present technology is applied.

In FIG. 8, portions corresponding to the first embodiment described above are denoted by the same reference numerals and symbols, and the description thereof will be appropriately omitted.

The solid-state imaging device 1 according to the second embodiment illustrated in FIG. 8 is different from that according to the first embodiment illustrated in FIG. 1 in that the solid-state imaging device 1 according to the second embodiment includes the AD converting units 13C and 13D instead of the AD converting units 13A and 13B.

The object pixel column for performing the AD conversion process according to the first embodiment is divided into the AD converting unit 13A and the AD converting unit 13B for the odd pixel column and the even pixel column. The object pixel column for performing the AD conversion process according to the second embodiment is divided into the AD converting unit 13C and the AD converting unit 13D for the right half and the left half of the pixel array 11.

Specifically, the plurality of column AD converting units 20A of the AD converting unit 13C are connected to the vertical signal lines 17 in the pixel columns on the left half of the pixel array 11 one by one. In addition, the plurality of column AD converting units 20B of the AD converting unit 13D are connected to the vertical signal lines 17 in the pixel column on the right half of the pixel array 11 one by one.

Accordingly, the AD converting unit 13C arranged under the pixel array 11 performs the CDS process and the AD conversion process on the pixel signal VSL output from the pixel 2 in the pixel column on the left half of the pixel array 11. Meanwhile, the AD converting unit 13D arranged over the pixel array 11 performs the CDS process and the AD conversion process on the pixel signal VSL output from the pixel 2 in pixel column on the right half of the pixel array 11.

The ramp signal RAMP1 of which the level is decreased with a constant slope over time is supplied from the DAC 18a to the AD converting unit 13C arranged under the pixel array 11 in the same manner as in the related art. Meanwhile, the ramp signal RAMP2 of which the level is increased with a constant slope over time in the D-phase period is supplied from the DAC 18b to the AD converting unit 13D arranged over the pixel array 11. Accordingly, in the solid-state imaging device 1 of FIG. 8, even if the pixel signals VSL are on the same level, the inversion timings for the outputs of the comparator in the AD converting unit 13C arranged under the pixel array 11 are different from the inversion timings for the outputs of the comparator in the AD converting unit 13D arranged over the pixel array 11. According to this, since the distortion amounts of the ramp signals RAMP1 and RAMP2 when the outputs of the comparators 31A and 31B are simultaneously inverted are smaller than the distortion amount of the ramp signal RAMP according to the related art as illustrated in FIG. 4, the generation of the streaking can be decreased in the second embodiment compared with the related art.

Further, according to the present embodiment, the ramp signal RAMP1 is supplied to the AD converting unit 13C that performs the AD conversion process on the pixel signal VSL in the pixel column on the left half, and the ramp signal RAMP2 is supplied to the AD converting unit 13D that performs the AD conversion process on the pixel signal VSL in the pixel column on the right half. However, the ramp signal RAMP2 may be supplied to the AD converting unit 13C and the ramp signal RAMP1 may be supplied to the AD converting unit 13D.

As described above, in the solid-state imaging device 1 according to the first and second embodiments, the plurality of pixel columns of the pixel array 11 are divided into two groups of the first group and the second group, and the inversion timing of the outputs of the comparator is configured to be different from that in the first group and the second group. According to this, the generation of the streaking can be decreased (by half) compared to the related art. In addition, since the fluctuations of the power supply voltage and the GND voltage caused by the simultaneous inversion of the comparator are decreased, noises also can be decreased. Further, since the circuit change or the complicated noise canceling circuit is not necessary for the comparator 31, the streaking can be decreased with a simple circuit configuration.

Application Example

According to any of the first and second embodiments described above, the AD conversion process is performed by dividing the plurality of pixel columns of the pixel array 11 into two groups. However, it may be configured so that the plurality of the pixel columns of the pixel array 11 are divided into three or more groups and each group has different inversion timings of the outputs of the comparator.

For example, the plurality of pixel columns of the pixel array 11 are divided into three groups. In the first group, the solid-state imaging device 1 performs the AD conversion process using the ramp signal RAMP1 of which the level is decreased with a constant slope in the D-phase period. In addition, in the second group, the solid-state imaging device 1 performs the AD conversion process using the ramp signal RAMP2 of which the level is increased with a constant slope in the D-phase period. Subsequently, in the third group, the solid-state imaging device 1 delays the ramp signal RAMP1 together with the pixel signal VSL in a time axis direction and then performs the AD conversion process in the same manner as in the first group.

Otherwise, the inversion timing of the outputs of the comparator in the third group may be set to be different from those in the first and the second groups, for example, by extending the D range and offsetting the levels of the ramp signal RAMP1 and the pixel signal VSL in the level direction. In addition, the inversion timing of the outputs of the comparator in the third group can be set to be different from those in the first and second group by using the solid-state imaging device 1 in which the slope and the count clocks of the ramp signals RAMP1 and RAMP2 are changed.

When the plurality of pixel columns of the pixel array 11 are divided into four or more groups, the inversion timings of the outputs of the comparator can be configured so as to be different from each other by appropriately combining the plurality of methods described above.

In addition, in a configuration in which the inversion timings of the outputs of the comparator are different from those of the first group and the second group, for example, the movement of the pixel signal VSL for electrons can be made to be opposite to that of the pixel signal VSL for holes by inverting the P type and the N type of the semiconductor substrate in the pixel column of the first group in the pixel array 11 from those in the pixel column of the second group in the pixel array 11.

3. Third Embodiment

Configuration Example of Electronic Apparatus to which the Present Technology is Applied The present technology is not limited to be applied to the solid-state imaging device. That is, the present technology can be applied to the entire electronic apparatus using a solid-state imaging device in an image reading unit (photoelectric converting unit), such as an imaging device including a digital still camera, a video camera, or the like, a portable terminal apparatus having an imaging function, and a camera using a solid-state imaging device in an image reading unit. The solid-state imaging device may have a structure formed with one chip, or may be a module-like structure that is obtained by packaging an imaging unit, a signal processing unit, or an optical system together and that has an imaging function.

Figure 9:
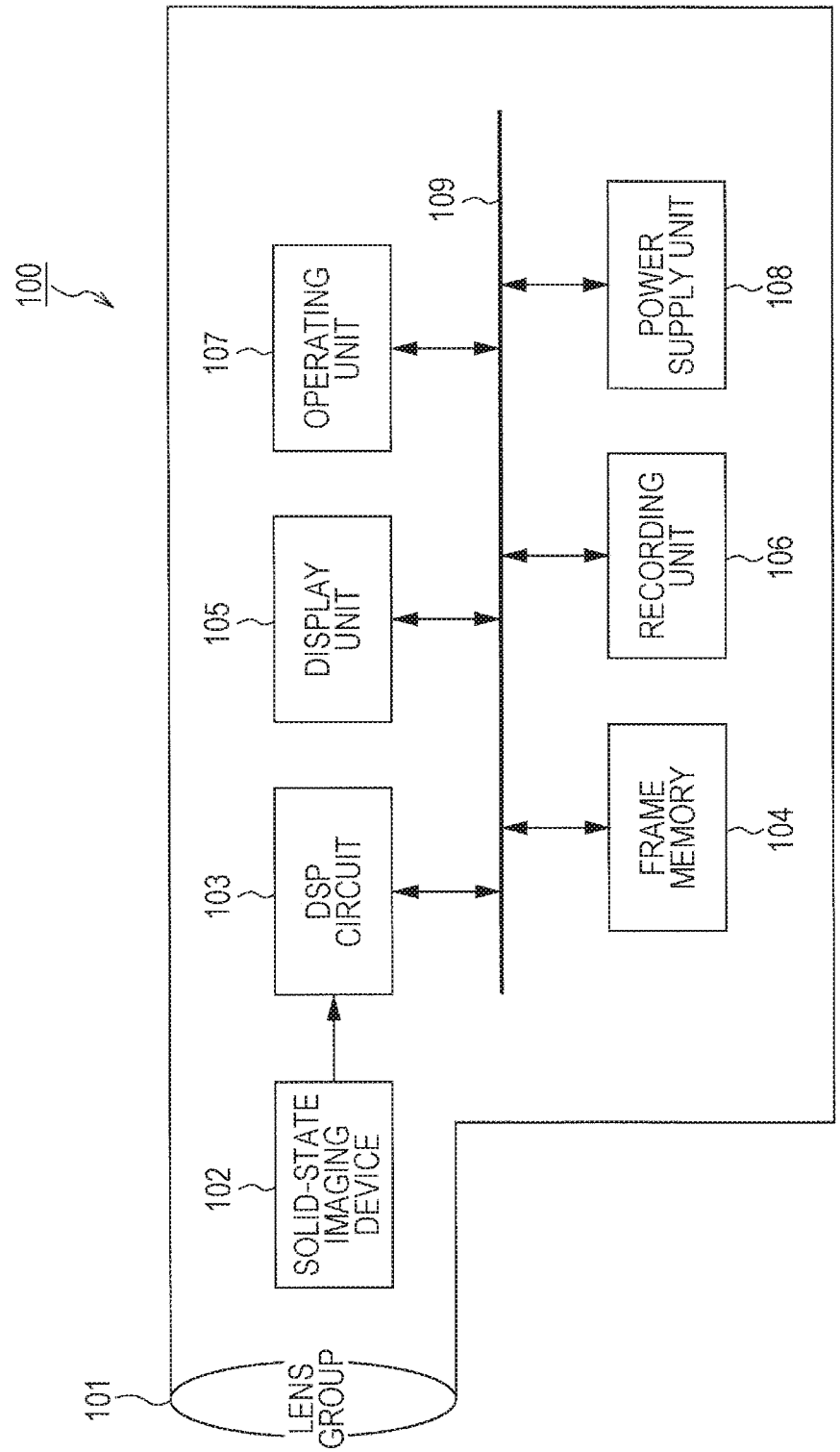
FIG. 9 is a block diagram illustrating a configuration example of an imaging device as an electronic apparatus to which the present technology is applied.

FIG. 9 is a block diagram illustrating a configuration example of an imaging device as an electronic apparatus to which the present technology is applied.

An imaging device 100 of FIG. 9 includes an optical unit 101 made of a lens group, a solid-state imaging device (imaging device) 102 to which a configuration of the solid-state imaging device 1 of FIG. 1 or 8 is applied, and a DSP (Digital Signal Processor) circuit 103 that is a camera signal processing circuit. In addition, the imaging device 100 includes a frame memory 104, a display unit 105, a recording unit 106, an operating unit 107, and a power supply unit 108. The DSP circuit 103, the frame memory 104, the display unit 105, the recording unit 106, the operating unit 107, and the power supply unit 108 are connected to each other through bus lines 109.

The optical unit 101 receives incident light (image light) from the object and forms an image on the imaging surface of the solid-state imaging device 102. The solid-state imaging device 102 converts the light amount of the incident light used for forming the image on the imaging surface by the optical unit 101 into an electric signal by a pixel unit, and outputs the converted electric signal as a pixel signal. The solid-state imaging device 1 of FIG. 1 or 8, that is, the solid-state imaging device in which the generation of the streaking can be decreased, can be used as the solid-state imaging device 102.

The display unit 105 is formed with a panel-type display apparatus, for example, a liquid crystal panel or an organic Electro Luminescence (EL) panel, and displays a moving image or a still image captured by the solid-state imaging device 102. The recording unit 106 records the moving image or the still image captured by the solid-state imaging device 102 on a recording medium such as a hard disk or a semiconductor memory.

The operating unit 107 performs an operation instruction with respect to various functions of the imaging device 100 under the operation of the user. The power supply unit 108 appropriately supplies various types of power supply that are the power supply for operating the DSP circuit 103, the frame memory 104, the display unit 105, the recording unit 106, and the operating unit 107, for the supply object thereof.

As described above, the generation of the streaking can be decreased by using the solid-state imaging device 1 according to the embodiment described above, as the solid-state imaging device 102. Accordingly, the quality of the captured image can be enhanced also in the imaging device 100 such as a camera module provided in a video camera, a digital still camera, or a mobile apparatus such as a cellular phone.

In addition, the application of the present technology is not limited to the solid-state imaging device that captures an image by detecting the distribution of an incident light amount of visible light, but the present technology can be applied to a solid-state imaging device that captures an image by detecting the distribution of an incident amount of infrared light, X rays, particles, or the like, or, in a broader sense, all solid-state imaging devices (physical quantity distribution detecting apparatus) such as a finger print detecting sensor that captures an image by detecting the distribution of other physical amounts such as pressure or electrostatic capacity.

Further, the solid-state imaging device may be an embodiment that is formed with one chip, or may be a module-like structure that is obtained by packaging an imaging unit, a signal processing unit, or an optical system together and that has an imaging function.

Embodiments of the present technology are not limited to the embodiments described above, but various modifications are possible without departing from the gist of the present technology.

Further, the present technology may have configurations described below.

(1)
An AD converter including:
a first AD converting unit in which a plurality of pixel columns of a pixel array are divided into at least two groups, and that compares a first ramp signal among the two groups and a first pixel signal output from a first group of the pixel columns and performs AD conversion on the first pixel signal; and
a second AD converting unit that compares a second ramp signal and a second pixel signal output from a second group of the pixel columns different from the first group in the pixel array and performs AD conversion on the second pixel signal,
in which the first ramp signal is a signal of which a level is decreased with a constant slope over time in a D-phase period for detecting a signal level of a pixel signal, and
the second ramp signal is a signal of which a level is increased with a constant slope over time in the D-phase period.

(2)
The AD converter according to (1),
in which the plurality of pixel columns of the pixel array are divided into two groups, and
the first group and the second group are divided into odd pixel columns and even pixel columns of the pixel array.

(3)
The AD converter according to (1) or (2),
in which the second AD converting unit adds a count value from a time at which the level of the second ramp signal starts to increase in the D-phase period to a time at which the level of the second ramp signal becomes the same as a level of the second pixel signal to a result obtained by adding a maximum count value of the D-phase period to a count value of a P-phase period for detecting a reset level before the D-phase period.

(4)
The AD converter according to (1) or (2),
in which the second AD converting unit adds a count value from a time at which the level of the second ramp signal starts to increase in the D-phase period so that the level of the second ramp signal becomes the same as a level of the second pixel signal to a time in which the level of the second ramp signal becomes a maximum level, to a count value of a P-phase period for detecting a reset level before the D-phase period.

(5)
The AD converter according to any one of (1) to (4), further including:
a reference signal generating unit that generates the first ramp signal and the second ramp signal.

(6)

The AD converter according to any one of (1) and (3) to (5),
  in which the plurality of pixel columns of the pixel array are divided into two groups, and
  in which the first group and the second group are divided into a right half and a left half of all pixel columns of the pixel array.

(7)

The AD converter according to any one of (3) to (5),
  in which the plurality of pixel columns of the pixel array are divided into three groups.

(8)

A signal processing method of an AD converter including a first AD converting unit in which a plurality of pixel columns of a pixel array are divided into at least two groups and that performs AD conversion on a first pixel signal output from a first group of the pixel columns among the two groups, and a second AD converting unit that performs AD conversion on a second pixel signal output from a second group of the pixel columns different from the first group in the pixel arrays, the method including:
  performing AD conversion on the first pixel signal by comparing the first pixel signal and a first ramp signal, of the first AD converting unit; and
  performing AD conversion on the second pixel signal by comparing the second pixel signal and a second ramp signal, of the second AD converting unit,
  in which the first ramp signal is a signal of which a level is decreased with a constant slope over time in a D-phase period for detecting a signal level of a pixel signal, and
  the second ramp signal is a signal of which a level is increased with a constant slope over time in the D-phase period.

(9)

A solid-state imaging device including:
  a pixel array in which a plurality of pixels are 2-dimensionally arranged in a matrix shape;
  a first AD converting unit in which a plurality of pixel columns of a pixel array are divided into at least two groups, and that compares a first ramp signal and a first pixel signal output from a first group of the pixel columns among the two groups and performs AD conversion on the first pixel signal; and
  a second AD converting unit that compares a second ramp signal and a second pixel signal output from a second group of the pixel columns different from the first group in the pixel array and performs AD conversion on the second pixel signal,
  in which the first ramp signal is a signal of which a level is decreased with a constant slope over time in a D-phase period for detecting a signal level of a pixel signal, and
  the second ramp signal is a signal of which a level is increased with a constant slope over time in the D-phase period.

(10)

An electronic apparatus including:
  a solid-state imaging device that includes
    a pixel array in which a plurality of pixels are 2-dimensionally arranged in a matrix shape,
    a first AD converting unit in which a plurality of pixel columns of a pixel array are divided into at least two groups, and that compares a first ramp signal and a first pixel signal output from a first group of the pixel columns among the two groups and performs AD conversion on the first pixel signal, and
    a second AD converting unit that compares a second ramp signal and a second pixel signal output from a second group of the pixel columns different from the first group in the pixel array and performs AD conversion on the second pixel signal,
    in which the first ramp signal is a signal of which a level is decreased with a constant slope over time in a D-phase period for detecting a signal level of a pixel signal, and
    the second ramp signal is a signal of which a level is increased with a constant slope over time in the D-phase period.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device comprising:
  a pixel array including a first pixel and a second pixel, the first pixel configured to output a first pixel signal, the second pixel configured to output a second pixel signal;
  a first plurality of analog-to-digital (A/D) converters disposed along a first side of the pixel array;
  a first reference signal generation circuit that outputs a first reference signal having a first waveform;
  a second plurality of A/D converters disposed along a second side of the pixel array; and
  a second reference signal generation circuit that outputs a second reference signal having a second waveform, the second waveform being different from the first waveform, the second waveform being inverted from the first waveform during a data phase period, wherein
  the first plurality of A/D converters is coupled to the first reference generation circuit to receive the first reference signal, and the second plurality of A/D converters is coupled to the second reference generation circuit to receive the second reference signal.

2. The imaging device according to claim 1, wherein the first pixel is among a first group of pixels included in the pixel array and the second pixel is among a second group of pixels included in the pixel array.

3. The imaging device according to claim 2, wherein the first group of pixels are respectively connected to the first plurality of A/D converters, and the second group of pixels are respectively connected to the second plurality of A/D converters.

4. The imaging device according to claim 1, wherein a period of time comprises a detection period for at least one of the first pixel signal or the second pixel signal.

5. The imaging device according to claim 1, wherein at least one of the first plurality of A/D converters or at least one of the second plurality of A/D converters implements a count value over a period of time to respectively detect at least one of the first pixel signal or the second pixel signal.

6. An electronic apparatus comprising the imaging device according to claim 1.

7. The electronic apparatus according to claim 6, wherein the first pixel is among a first group of pixels included in the pixel array and the second pixel is among a second group of pixels included in the pixel array.

8. The electronic apparatus according to claim 6, wherein a period of time comprises a detection period for at least one of the first pixel signal or the second pixel signal.

9. The electronic apparatus according to claim 6, wherein at least one of the first A/D converters or at least one of the second A/D converters implements a count value over a period of time to respectively detect at least one of the first pixel signal or the second pixel signal.

10. The electronic apparatus according to claim 7, wherein the first group of pixels are respectively connected to the first group of A/D converters, and the second group of pixels are respectively connected to the second group of A/D converters.

* * * * *